(12) United States Patent
Yokogawa et al.

(10) Patent No.: US 11,915,988 B2
(45) Date of Patent: Feb. 27, 2024

(54) SEMICONDUCTOR DEVICE AND POWER CONVERTER

(71) Applicant: Mitsubishi Electric Corporation, Tokyo (JP)

(72) Inventors: Masahiro Yokogawa, Tokyo (JP); Kensuke Taguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/048,314

(22) PCT Filed: Apr. 26, 2019

(86) PCT No.: PCT/JP2019/017854
§ 371 (c)(1),
(2) Date: Oct. 16, 2020

(87) PCT Pub. No.: WO2019/208755
PCT Pub. Date: Oct. 31, 2019

(65) Prior Publication Data
US 2021/0166984 A1  Jun. 3, 2021

(30) Foreign Application Priority Data

Apr. 27, 2018 (JP) .................................. 2018-087136

(51) Int. Cl.
*H01L 23/29* (2006.01)
*H01L 23/31* (2006.01)
(Continued)

(52) U.S. Cl.
CPC ........ *H01L 23/293* (2013.01); *H01L 23/3157* (2013.01); *H01L 23/34* (2013.01);
(Continued)

(58) Field of Classification Search
CPC ............... H01L 29/1608; H01L 29/861; H01L 2224/0603; H01L 29/66068
See application file for complete search history.

(56) References Cited

U.S. PATENT DOCUMENTS

| | | | |
|---|---|---|---|
| 2002/0034087 | A1 | 3/2002 | Suzuki et al. |
| 2011/0220917 | A1 | 9/2011 | Hayashi et al. |
| | | (Continued) | |

FOREIGN PATENT DOCUMENTS

| | | | |
|---|---|---|---|
| JP | 2002095268 | A | 3/2002 |
| JP | 2007048889 | A | 2/2007 |
| | (Continued) | | |

OTHER PUBLICATIONS

Office Action dated Feb. 8, 2022, issued in corresponding Japanese Patent Application No. 2020-515593, 8 pages including 4 pages of English Translation.

(Continued)

*Primary Examiner* — Samuel A Gebremariam
*Assistant Examiner* — Jonas T Beardsley
(74) *Attorney, Agent, or Firm* — BUCHANAN INGERSOLL & ROONEY PC

(57) ABSTRACT

A first electrode film is electrically connected to a source region of a semiconductor substrate, and disposed over a main surface of the semiconductor substrate. A second electrode film is electrically connected to a gate electrode, and disposed over the main surface. A third electrode film is disposed over the main surface away from the first electrode film. A protective dielectric film is disposed over the main surface, covers only a portion of each of the first electrode film and the second electrode film and covers at least portion of the third electrode film, and is made of a thermosetting resin. The main surface has a peripheral region and an inner region enclosed by the peripheral region, and the protective (Continued)

dielectric film has a peripheral portion covering the peripheral region and has a first inner portion crossing the inner region and covering at least portion of the third electrode film.

19 Claims, 16 Drawing Sheets

(51) Int. Cl.
    *H01L 23/34*     (2006.01)
    *H01L 29/16*     (2006.01)
    *H01L 29/417*     (2006.01)
    *H01L 29/78*     (2006.01)
    *H02M 7/5387*     (2007.01)

(52) U.S. Cl.
    CPC .... *H01L 29/1608* (2013.01); *H01L 29/41775* (2013.01); *H01L 29/7803* (2013.01); *H01L 29/7813* (2013.01); *H02M 7/53871* (2013.01)

(56) References Cited

U.S. PATENT DOCUMENTS

| | | | |
|---|---|---|---|
| 2011/0233544 | A1 | 9/2011 | Honda |
| 2012/0132912 | A1* | 5/2012 | Suekawa ............ H01L 29/7804 257/49 |
| 2012/0305945 | A1 | 12/2012 | Hirano |
| 2015/0372095 | A1* | 12/2015 | Saito ................ H01L 21/28568 257/77 |
| 2016/0002093 | A1 | 1/2016 | Ito et al. |
| 2016/0241018 | A1* | 8/2016 | Nakano ............ H01L 29/66068 |
| 2017/0110545 | A1* | 4/2017 | Nagao ................ H01L 29/0619 |
| 2017/0111037 | A1* | 4/2017 | Shiigi ................ H01L 21/4853 |
| 2019/0019885 | A1 | 1/2019 | Naito |
| 2019/0057873 | A1* | 2/2019 | Sugahara ............ H01L 29/1608 |

FOREIGN PATENT DOCUMENTS

| | | |
|---|---|---|
| JP | 2011129662 A | 6/2011 |
| JP | 2011-210801 A | 10/2011 |
| JP | 2012129503 A | 7/2012 |
| JP | 2015220334 A | 12/2015 |
| JP | 2017054873 A | 3/2017 |
| JP | 2017079324 A | 4/2017 |
| JP | 2017168602 A | 9/2017 |
| WO | 2011027523 A1 | 3/2011 |
| WO | 2011102547 A1 | 8/2011 |
| WO | 2014155739 A1 | 10/2014 |
| WO | 2017169086 A1 | 10/2017 |
| WO | 2018/074425 A1 | 4/2018 |

OTHER PUBLICATIONS

International Search Report (PCT/ISA/210) dated Jul. 30, 2019, by the Japan Patent Office as the International Searching Authority for International Application No. PCT/JP2019/017854.

Written Opinion (PCT/ISA/237) dated Jul. 30, 2019, by the Japan Patent Office as the International Searching Authority for International Application No. PCT/JP2019/017854.

Office Action dated Jul. 20, 2021, issued in corresponding Japanese Patent Application No. 2020-515593, 12 pages including 6 pages of English translation.

Decision of Refusal dated Aug. 9, 2022, issued in the corresponding Japanese Patent Application No. 2020-515593, 6 pages including 3 pages of English Translation.

First Office Action dated Nov. 16, 2023, issued in the corresponding Chinese Patent Application No. 201980027280.6, 18 pages including 10 pages of English Translation.

* cited by examiner

F I G. 8
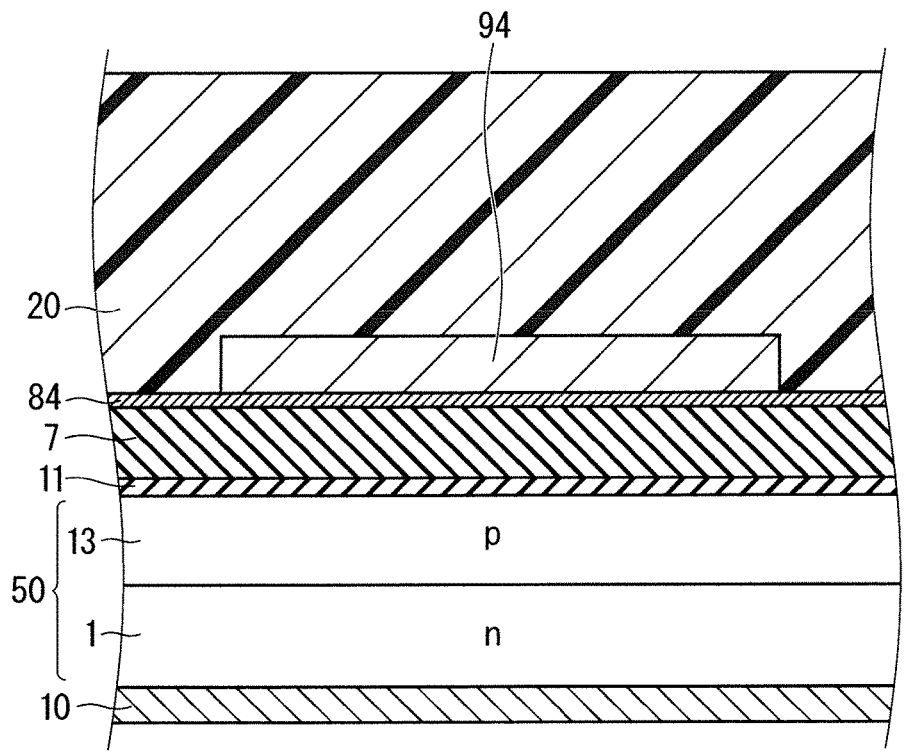
F I G. 9
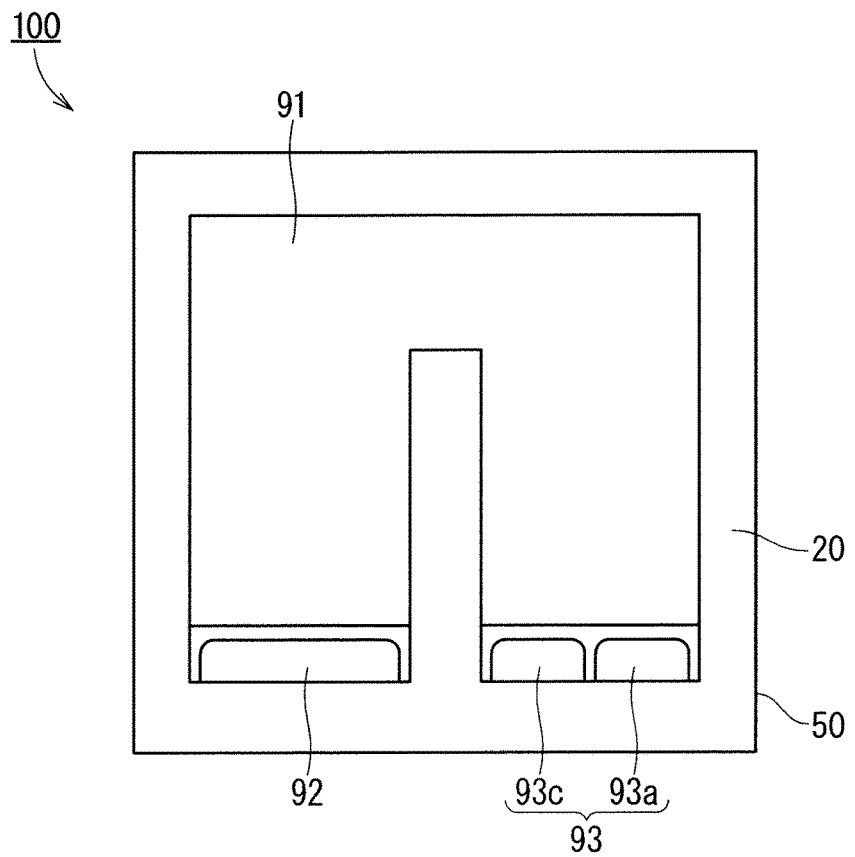

F I G. 1 0
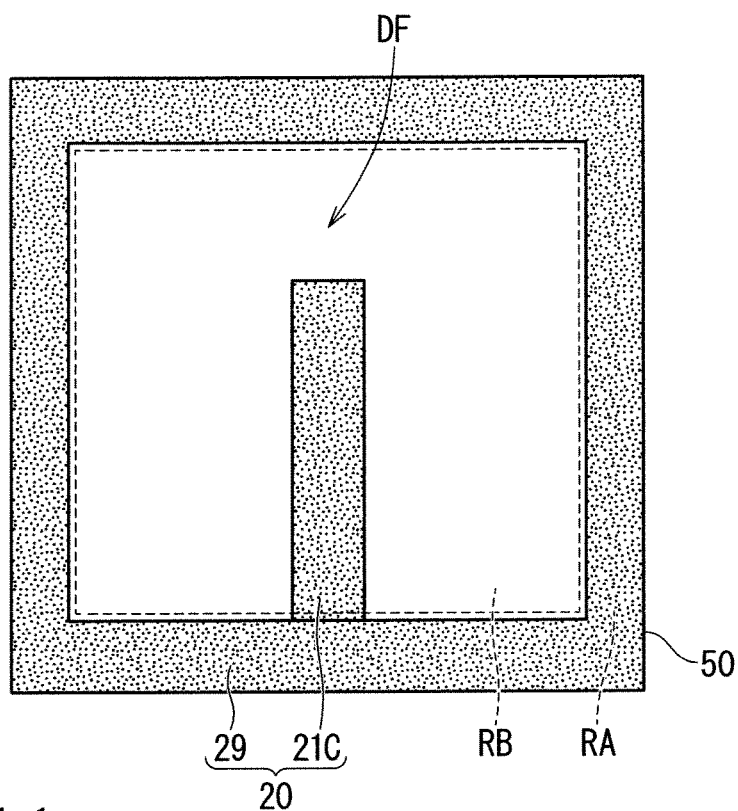
F I G. 1 1
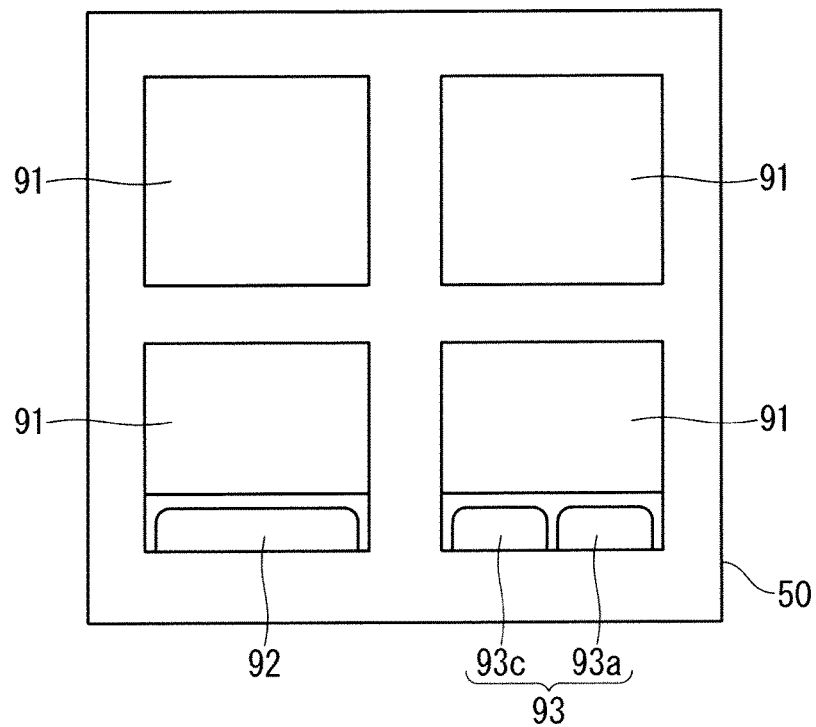

F I G. 1 2
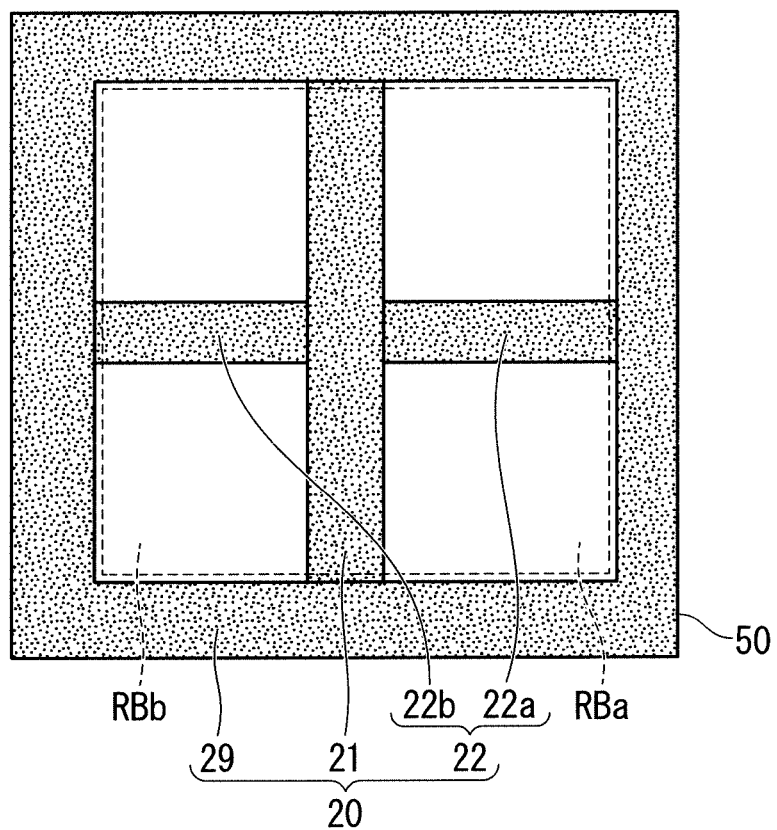

F I G. 1 3
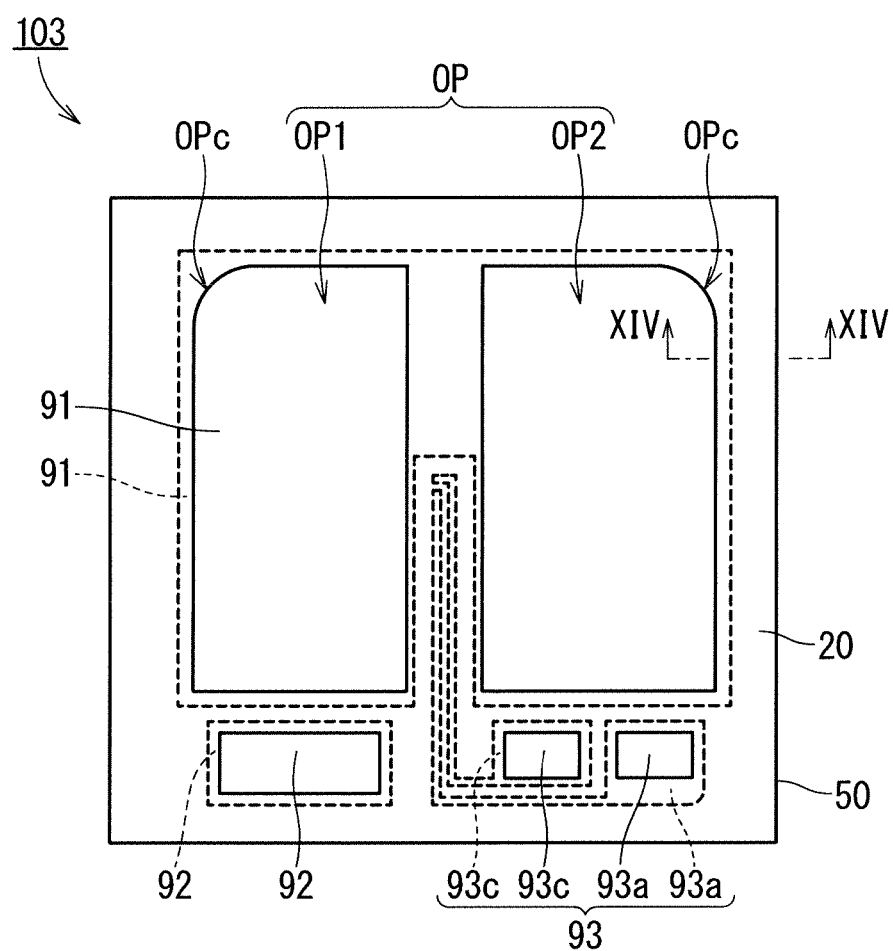

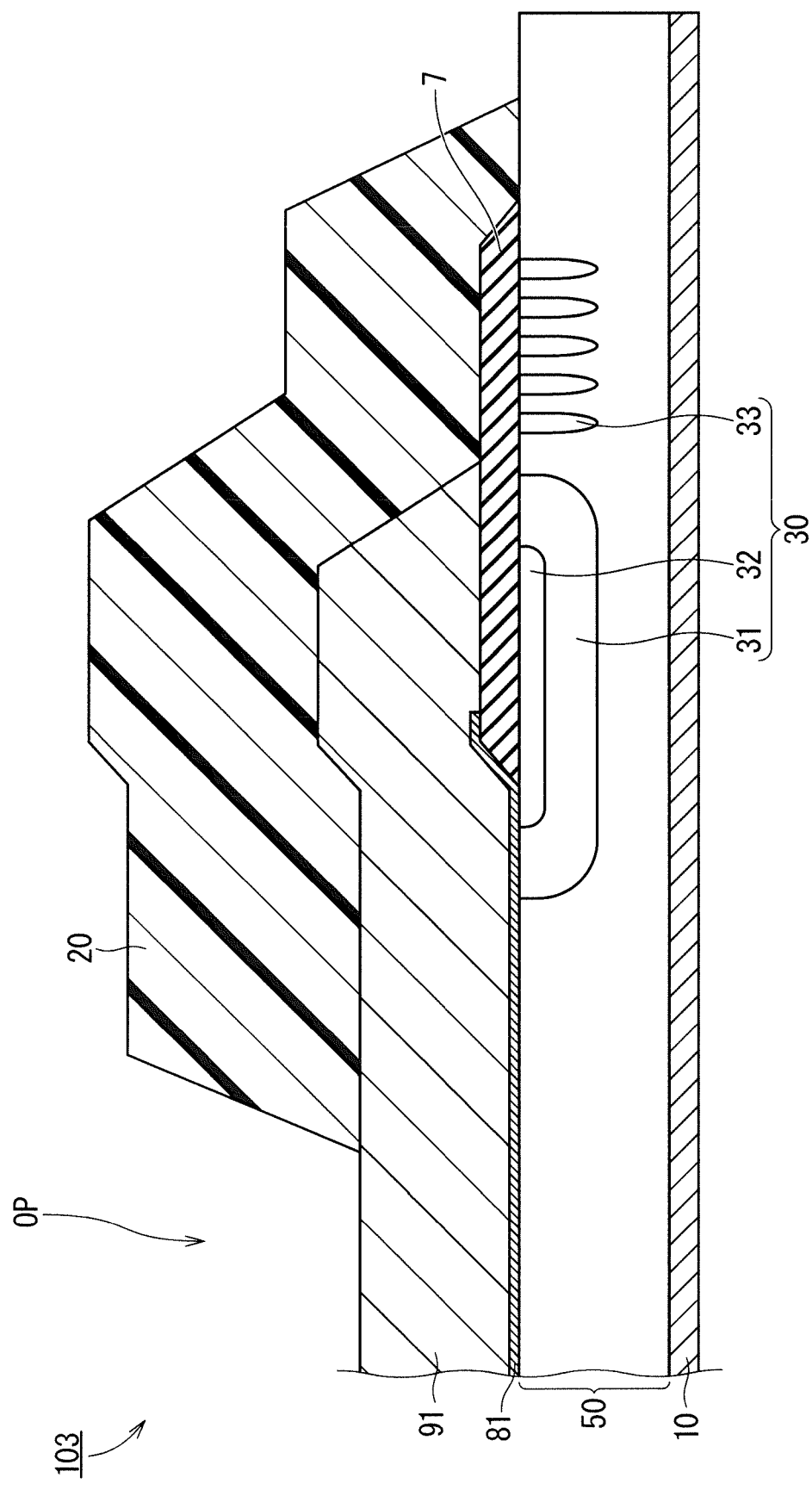

F I G. 1 8
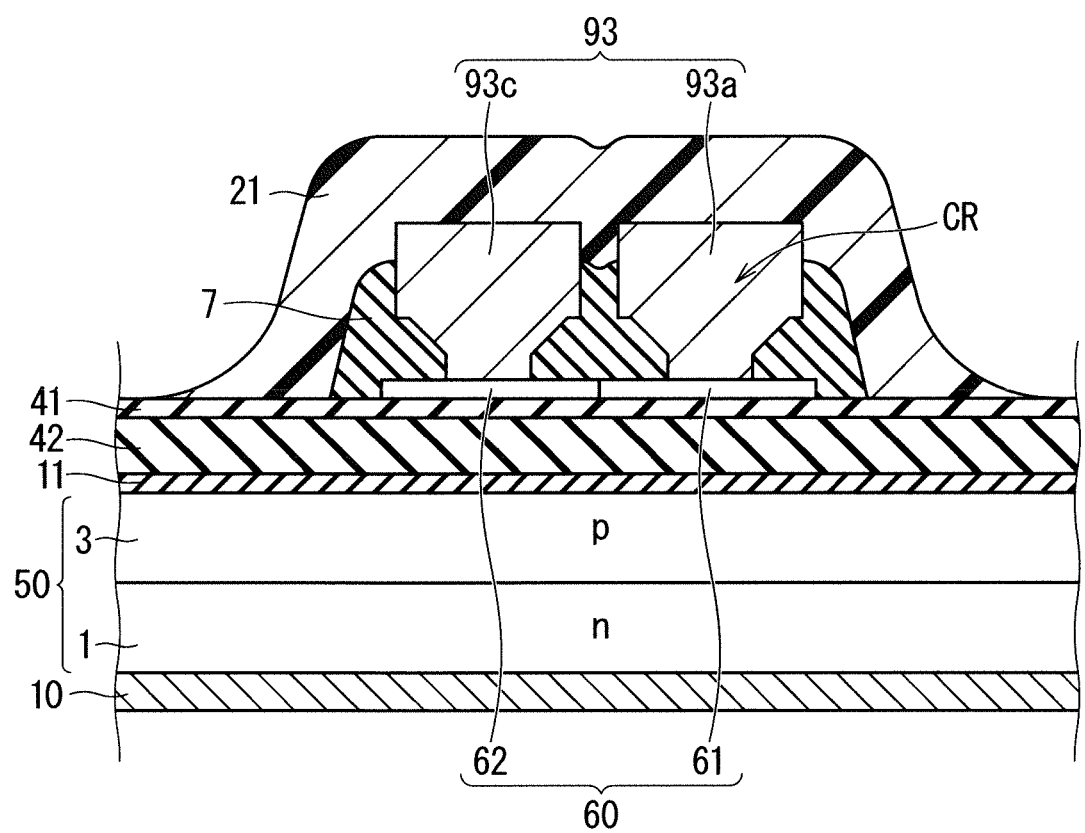

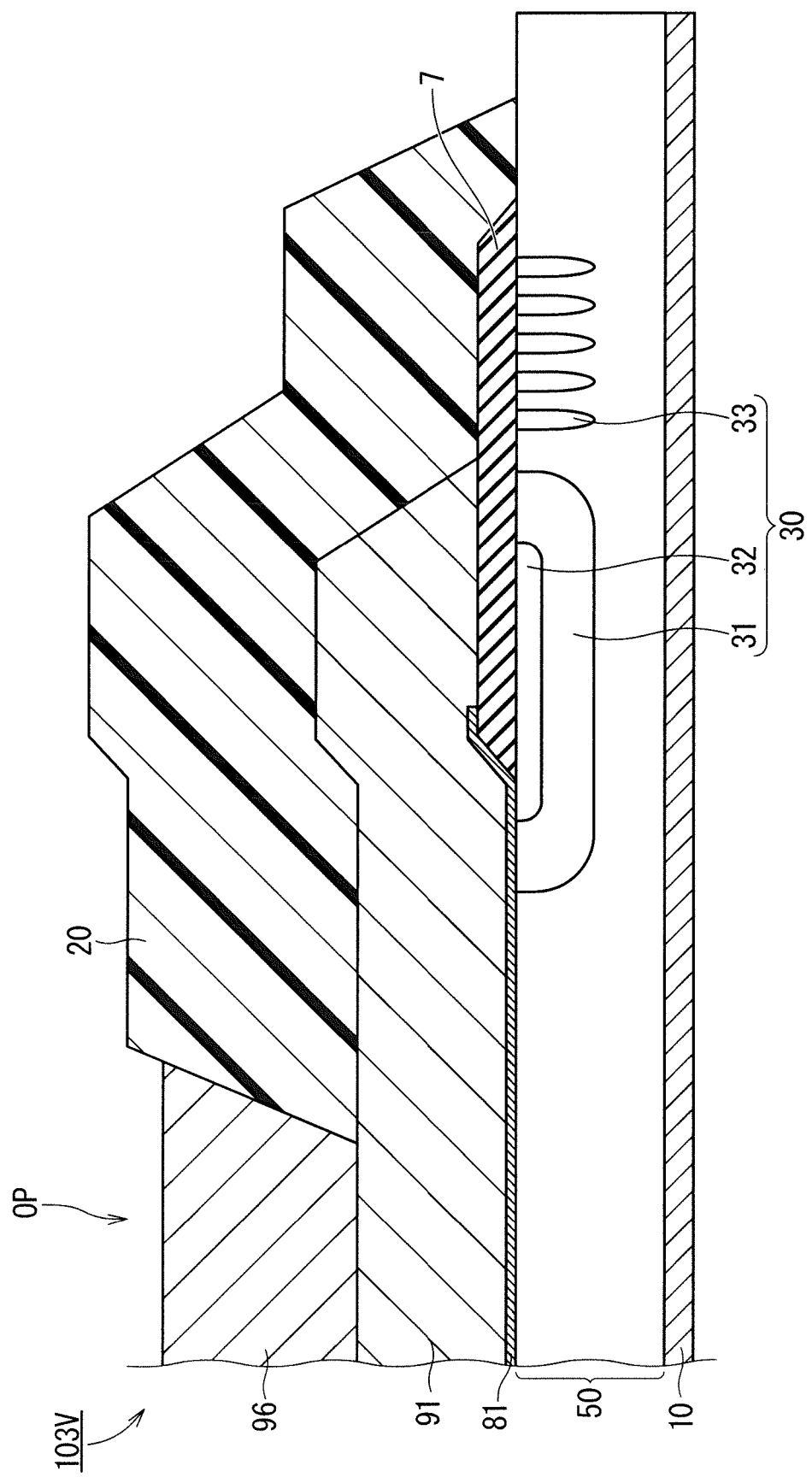

SEMICONDUCTOR DEVICE AND POWER CONVERTER

TECHNICAL FIELD

The present invention relates to semiconductor devices and power converters, and, in particular, to a semiconductor device including a protective dielectric film made of a thermosetting resin and a power converter.

BACKGROUND ART

Patent Document 1 discloses a power converter including an inverter circuit. The power converter includes a semiconductor device as a switching element. In a case where the power converter is in a driven state, the semiconductor device performs a switching operation. In this case, a lot of heat is generated from the semiconductor device. When the power converter alternates between a standby state and the driven state, the amount of heat generated from the semiconductor device greatly changes. The power converter is thus subjected to thermal cycling. To secure long-term reliability of the power converter, the power converter is required to have a module structure resistant to thermal cycling.

Patent Document 2 discloses a metal oxide semiconductor field effect transistor (MOSFET) manufactured using silicon carbide (SiC), that is, an SiC-MOSFET. On-resistance of the MOSFET can significantly be reduced by using SiC as a wide-bandgap semiconductor. The SiC-MOSFET is thus beginning to be applied to power converters these days. The MOSFET includes, as a protective dielectric film, a polyimide film having an opening.

Patent Document 3 discloses a MOSFET including a diode as a temperature sensor element and an anode electrode and a cathode electrode connected to the diode. An increase in temperature of the MOSFET caused by the above-mentioned heat can be sensed by the temperature sensor element. Operation of the MOSFET can further be stabilized by referring to information as sensed.

PRIOR ART DOCUMENTS

Patent Documents

Patent Document 1: Japanese Patent Application Laid-Open No. 2002-095268
Patent Document 2: Japanese Patent Application Laid-Open No. 2017-168602
Patent Document 3: Japanese Patent Application Laid-Open No. 2012-129503

SUMMARY

Problem to be Solved by the Invention

Technology disclosed in Patent Document 1 described above has been conceived to enhance reliability of connection between the semiconductor device and members mounted thereon, and not to improve the configuration of the semiconductor device itself. Thus, high reliability cannot be obtained if the semiconductor device itself is vulnerable to thermal cycling.

According to technology disclosed in Patent Document 2 described above, the semiconductor device includes, as the protective dielectric film, the polyimide film having the opening. Due to the influence of thermal cycling, the protective dielectric film might be deteriorated to have, for example, cracking or wrinkling caused by a difference in density of a film and the like. Especially when a linear expansion coefficient (coefficient of linear expansion) in a semiconductor region is high, the protective dielectric film is likely to be deteriorated as a result of a widening difference between the linear expansion coefficient in the semiconductor region and a linear expansion coefficient of the protective dielectric film. For example, a linear expansion coefficient of SiC of 6.6 [$\times 10^{-6}$/K] is significantly higher than a linear expansion coefficient of silicon (Si) of 2.4 [$\times 10^{-6}$/K]. Furthermore, SiC is a semiconductor material more suitable for high temperature operation than Si, and thus a semiconductor device manufactured using SiC is often used at a high temperature. Stress applied to the protective dielectric film due to the difference in linear expansion coefficient can become much greater in a case of SiC than in a case of Si.

According to technology disclosed in Patent Document 3 described above, the semiconductor device has a structure including the diode as the temperature sensor element and the anode electrode and the cathode electrode connected to the diode. The document is silent on protecting the structure using a protective dielectric film. According to a study of the present inventors, the structure is desirably protected using the protective dielectric film to secure reliability. In this case, the shape of an opening of the protective dielectric film is affected by placement of the structure. Depending on the shape of the opening, local deterioration of the protective dielectric film is likely to progress.

The present invention has been conceived to solve a problem as described above, and it is one object to provide a semiconductor device capable of suppressing deterioration of a protective dielectric film.

Means to Solve the Problem

A semiconductor device of the present invention includes: a semiconductor substrate; a gate dielectric film; a gate electrode; a first electrode film; a second electrode film; a third electrode film; and a protective dielectric film. The semiconductor substrate is made of a semiconductor having a higher linear expansion coefficient than Si, includes a source region having a first conductivity type, a base region having a second conductivity type different from the first conductivity type, and a drift layer separated from the source region by the base region and having the first conductivity type, and has a main surface including a portion formed of the source region. The gate dielectric film covers the base region of the semiconductor substrate. The gate electrode faces the base region of the semiconductor substrate through the gate dielectric film. The first electrode film is electrically connected to the source region of the semiconductor substrate, and disposed over the main surface of the semiconductor substrate. The second electrode film is electrically connected to the gate electrode, and disposed over the main surface of the semiconductor substrate away from the first electrode film. The third electrode film is disposed over the main surface of the semiconductor substrate away from the first electrode film. The protective dielectric film is disposed over the main surface of the semiconductor substrate provided with the first electrode film, the second electrode film, and the third electrode film, covers only a portion of each of the first electrode film and the second electrode film and covers at least portion of the third electrode film, and is made of a thermosetting resin. The main surface of the semiconductor substrate has a peripheral region and an inner region enclosed by the peripheral region. The protective dielectric film has a peripheral portion covering the peripheral region and has a first inner portion covering at least portion of the third electrode film and crossing the inner region.

Effects of the Invention

According to the present invention, the protective dielectric film has the first inner portion covering at least portion of the third electrode film to protect a structure including the third electrode film. The first inner portion crosses the inner region enclosed by the peripheral portion of the protective dielectric film, so that one end and the other end of the first inner portion are each connected to the peripheral portion of the protective insulating film. This suppresses progress of local deterioration of the protective dielectric film at the one end and the other end of the first inner portion. Deterioration of the protective dielectric film can thereby be suppressed.

The objects, features, aspects, and advantages of the present invention will become more apparent from the following detailed description and the accompanying drawings.

BRIEF DESCRIPTION OF DRAWINGS

FIG. 8 is a partial sectional view schematically showing a configuration of a semiconductor device in a modification.

FIG. 9 is a plan view showing a configuration of a semiconductor device in a comparative example.

FIG. 10 is a plan view for describing a configuration of a protective dielectric film of the semiconductor device of FIG. 9.

FIG. 11 is a plan view schematically showing a configuration of a semiconductor device in Embodiment 2 of the present invention.

FIG. 12 is a plan view for describing a configuration of a protective dielectric film of the semiconductor device of FIG. 11.

FIG. 13 is a plan view schematically showing a configuration of a semiconductor device in Embodiment 3 of the present invention.

FIG. 14 is a schematic partial sectional view taken along the line XIV-XIV of FIG. 13.

FIG. 18 is a partial sectional view showing an example of a cross-sectional shape of a first inner portion of the protective dielectric film.

FIG. 19 is a partial sectional view schematically showing a configuration of a semiconductor device in a modification of FIG. 14.

DESCRIPTION OF EMBODIMENTS

Figure 1:
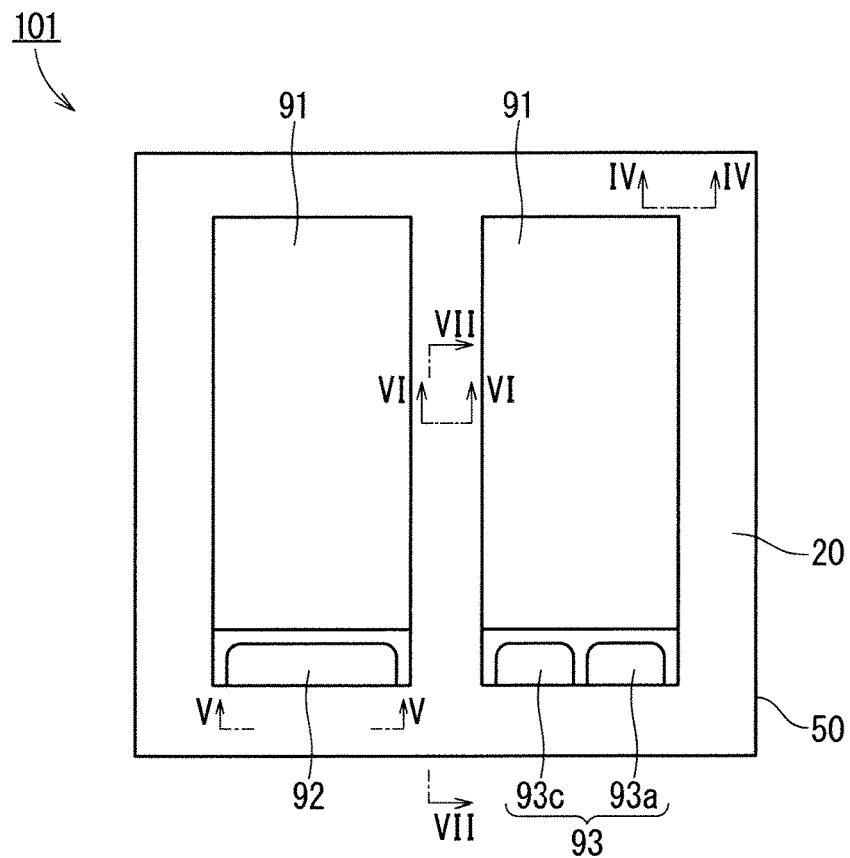
FIG. 1 is a plan view schematically showing a configuration of a semiconductor device in Embodiment 1 of the present invention.

Embodiments of the present invention will be described below based on the drawings. The same or equivalent components in the drawings bear the same reference sign, and description thereof is not repeated below.

Embodiment 1

Figure 2:
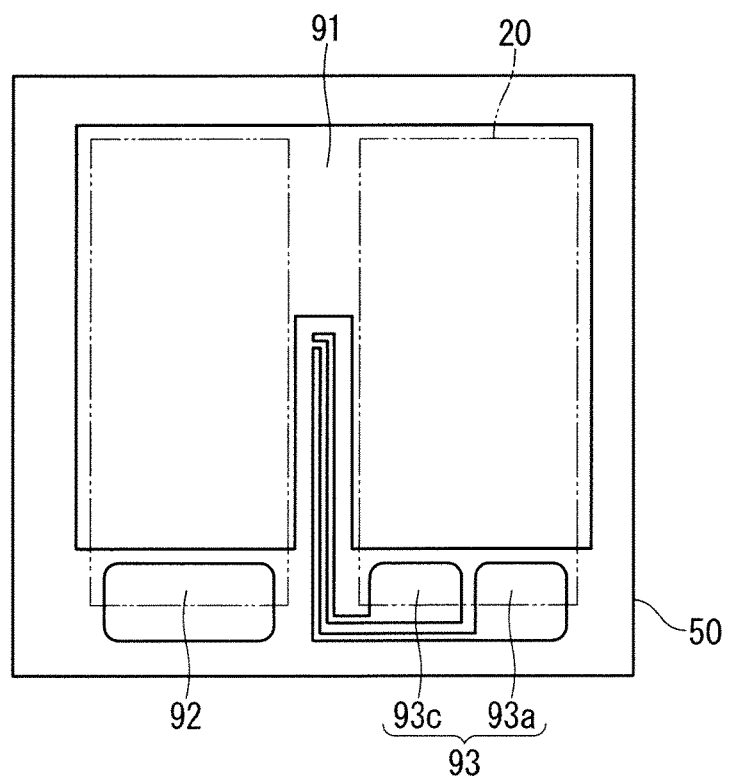
FIG. 2 is a plan view schematically showing the configuration of the semiconductor device of FIG. 1 without illustrating a protective dielectric film.
Figure 3:
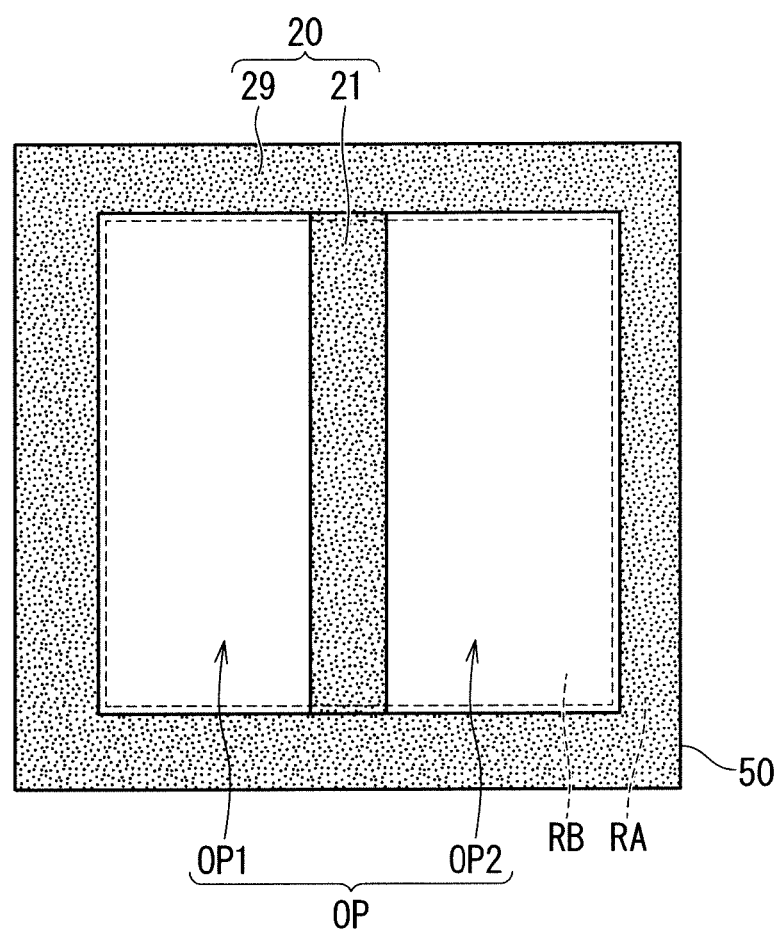
FIG. 3 is a plan view for describing a configuration of the protective dielectric film of the semiconductor device of FIG. 1.

FIG. 1 is a plan view schematically showing a configuration of a MOSFET 101 (semiconductor device) in Embodiment 1. FIG. 2 is a plan view schematically showing the configuration of the MOSFET 101 of FIG. 1 without illustrating a polyimide film 20 (protective dielectric film). FIG. 3 is a plan view for describing a configuration of the polyimide film 20 (FIG. 1). In FIG. 3, the polyimide film 20 is stippled for ease of viewing.

Figure 4:
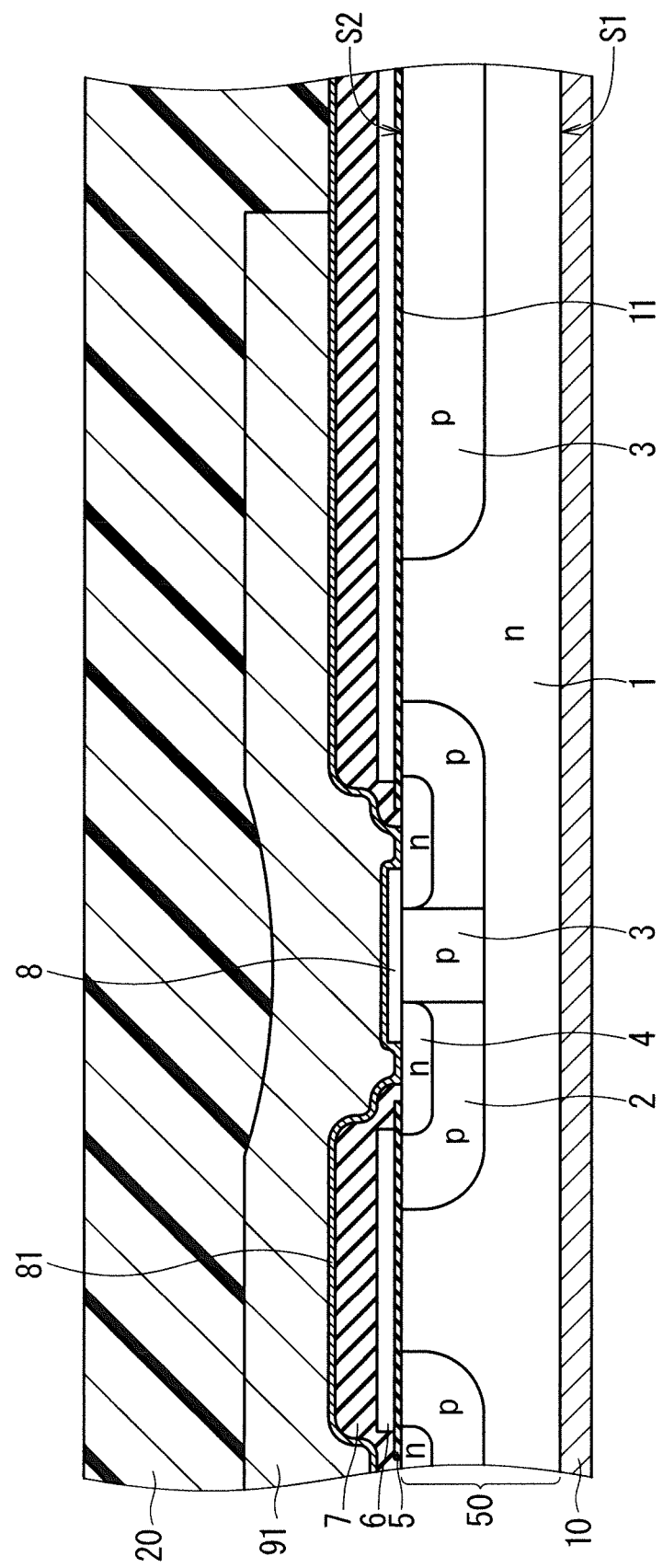
FIG. 4 is a schematic partial sectional view taken along the line IV-IV of FIG. 1.
Figure 5:
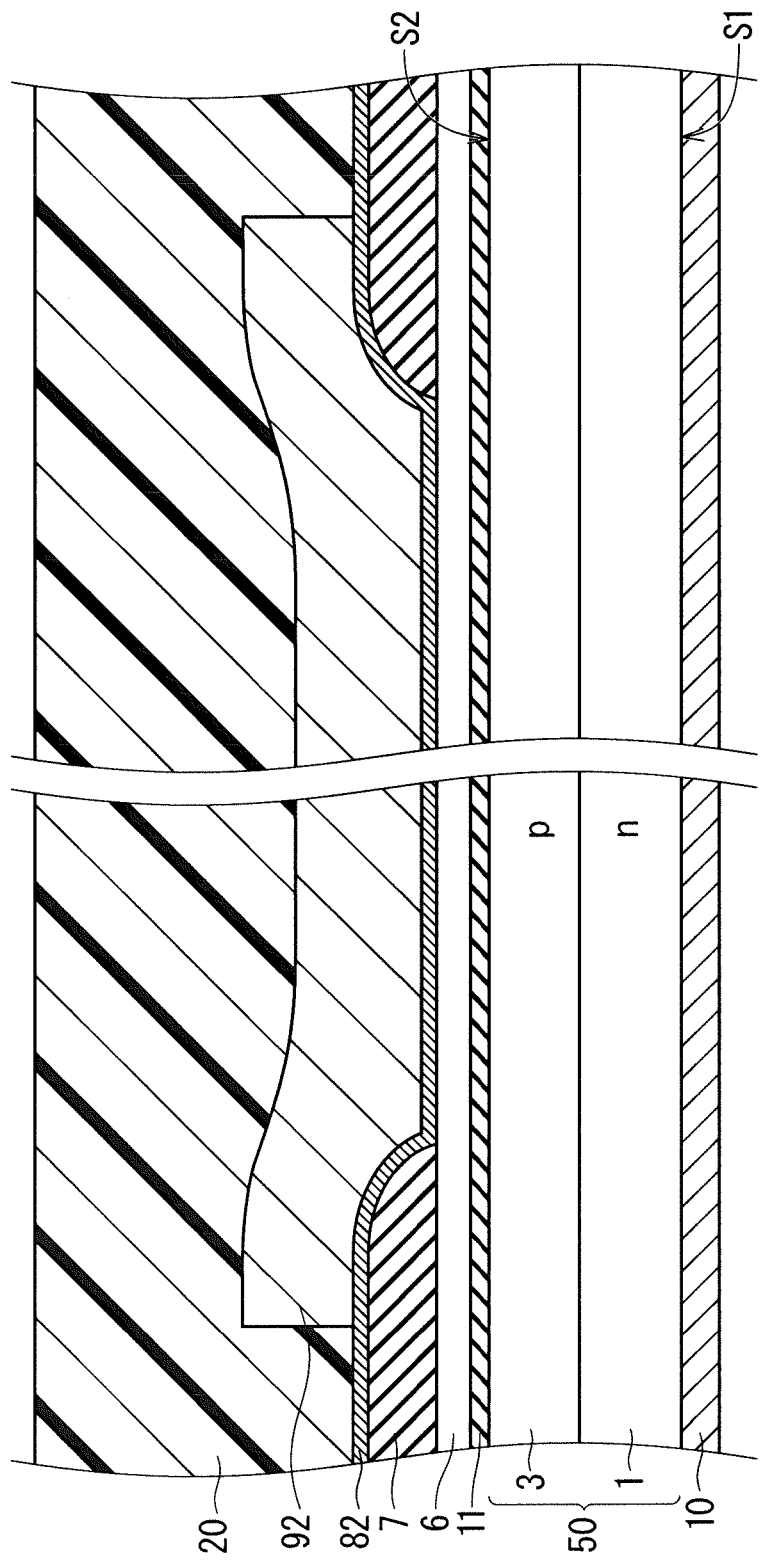
FIG. 5 is a schematic partial sectional view taken along the line V-V of FIG. 1.
Figure 6:
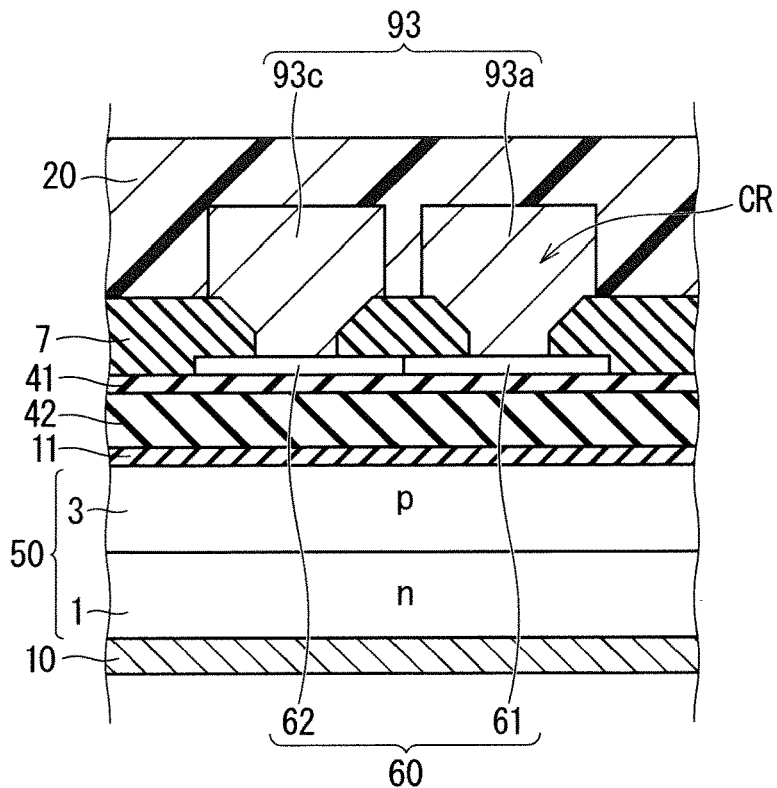
FIG. 6 is a schematic partial sectional view taken along the line VI-VI of FIG. 1.

FIGS. 4, 5, 6, and 7 are schematic partial sectional views respectively taken along the lines IV-IV, V-V, VI-VI, and VII-VII of FIG. 1. Although described in detail below, FIG. 4 taken along the line IV-IV (FIG. 1) corresponds to a portion in which an outer edge of a source electrode pad 91 (first electrode film) is covered with the polyimide film 20. FIG. 5 taken along the line V-V (FIG. 1) corresponds to a portion in which a gate electrode pad 92 (second electrode film) is covered with the polyimide film 20. FIG. 6 taken along the line VI-VI (FIG. 1) and FIG. 7 taken along the line VII-VII (FIG. 1) correspond to a portion in which a temperature sensor element 60 (FIG. 6) connected to an electrode film 93 (a third electrode film) is disposed.

As illustrated in FIG. 4, the MOSFET 101 includes an SiC substrate 50 (a semiconductor substrate), a gate dielectric film 5, a gate electrode 6, an interlayer dielectric film 7, a source contact electrode 8, the source electrode pad 91, the polyimide film 20, and a rear electrode 10. The MOSFET 101 may include a barrier film 81.

The SiC substrate 50 is made of SiC, and, as described above, SiC has a higher linear expansion coefficient than Si. The SiC substrate 50 includes a source region 4 having an n type (a first conductivity type), a base region 2 having a p type (second conductivity type different from the first conductivity type), a drift layer 1 having the n type, and a contact region 3 having the p type. The drift layer 1 is separated from the source region 4 by the base region 2. The SiC substrate 50 has a lower surface S1 and an upper surface S2 (a main surface) opposite the lower surface S1. The upper surface S2 includes a portion formed of the source region 4 and a portion formed of the contact region 3.

The gate dielectric film 5 covers the base region 2 of the SiC substrate 50. The gate electrode 6 faces the base region 2 of the SiC substrate 50 through the gate dielectric film 5. The gate electrode 6 is made of a material having conductivity, such as polysilicon doped with impurities. The gate electrode 6 has a planar structure in the present embodiment. In other words, the gate electrode 6 has a planar shape along the upper surface S2.

The source contact electrode 8 is in contact with the source region 4 and the contact region 3. A portion of the source contact electrode 8 being in contact with the source region 4 and the contact region 3 has preferably been silicided. The source contact electrode 8 is, for example, a nickel (Ni) electrode having a silicided portion facing the upper surface S2 of the SiC substrate 50.

The source electrode pad 91 is a terminal electrode to receive a supply of a source potential from an exterior of the MOSFET 101. The source electrode pad 91 is placed over the upper surface S2 on which the source contact electrode 8 is disposed. The source electrode pad 91 is in contact with the source contact electrode 8 to be electrically connected to the source region 4 and the contact region 3 of the SiC substrate 50. They may be electrically connected through the barrier film 81. The source electrode pad 91 and the gate electrode 6 are insulated from each other by the interlayer dielectric film 7. The interlayer dielectric film 7 is typically made of an inorganic material. The source electrode pad 91 is made of metal, such as aluminum (Al) and an alloy thereof.

The barrier film 81 is made of metal having a high ability to occlude hydrogen atoms or hydrogen ions, such as Ti (titanium). A process of manufacturing the MOSFET 101 is sometimes accompanied by generation of hydrogen atoms or hydrogen ions, and the barrier film 81 suppresses the entry of hydrogen atoms or hydrogen ions into the interlayer dielectric film 7. The barrier film 81 can also suppress the entry of hydrogen atoms or hydrogen ions from an exterior.

The rear electrode 10 is disposed on the lower surface S1 of the SiC substrate 50. The rear electrode 10 functions as a drain electrode of the MOSFET 101.

As illustrated in FIG. 5, the MOSFET 101 includes the gate electrode pad 92 and a silicon oxide film 11 (dielectric film), and may include a barrier film 82 made of metal. The barrier film 82 is made of a similar material to the barrier film 81, and thus has a similar function to the barrier film 81. The barrier film 82 is separated from the barrier film 81.

The gate electrode pad 92 is a terminal electrode to receive a supply of a gate potential from the exterior of the MOSFET 101. The gate electrode pad 92 is placed away from the source electrode pad 91 in plan view (FIG. 2). The gate electrode pad 92 is preferably approximately 1 μm or more away from the source electrode pad 91. The gate electrode pad 92 is placed over the upper surface S2 over which the gate electrode 6 is disposed. The gate electrode pad 92 is electrically connected to the gate electrode 6. They may be electrically connected through the barrier film 82. In the vicinity of the gate electrode pad 92, the gate electrode 6 and the upper surface S2 are insulated from each other by the silicon oxide film 11. The gate electrode pad 92 is made of metal, such as Al and an alloy thereof. The gate electrode pad 92 is preferably made of the same material as the source electrode pad 91.

Figure 7:
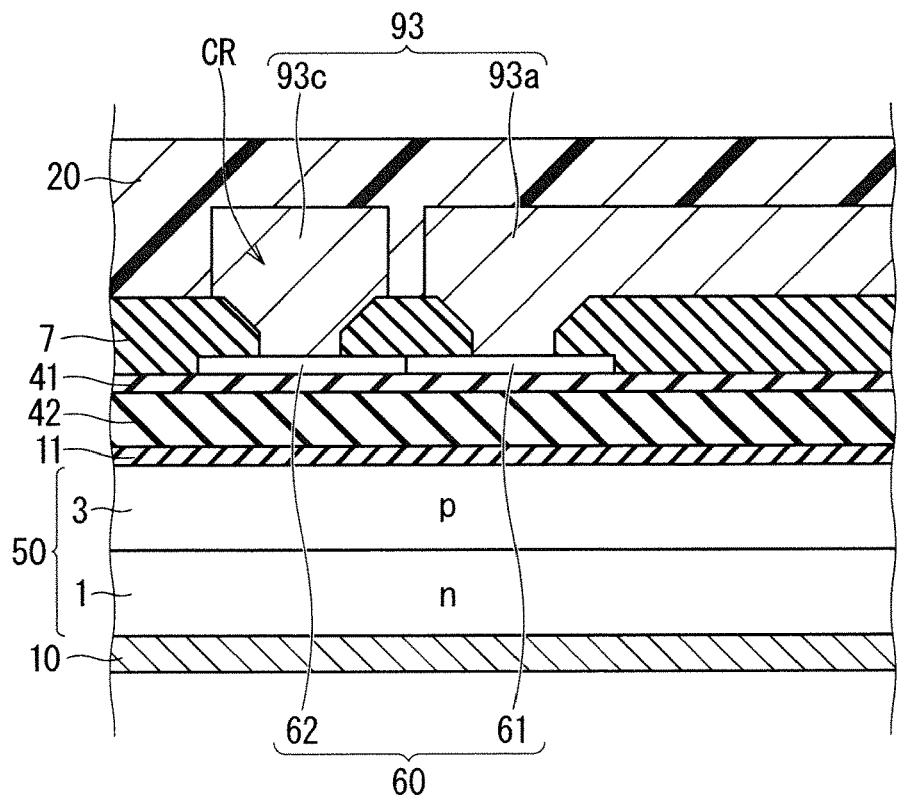
FIG. 7 is a schematic partial sectional view taken along the line VII-VII of FIG. 1.

As illustrated in FIGS. 6 and 7, the MOSFET 101 includes the electrode film 93 and the temperature sensor element 60 (an electrical element) connected to the electrode film 93. The MOSFET 101 may include an oxide film 41 (a dielectric film) and an interlayer dielectric film 42.

The electrode film 93 is placed away from the source electrode pad 91 in plan view (FIG. 2). The electrode film 93 is preferably approximately 1 μm or more away from the source electrode pad 91. In the present embodiment, the electrode film 93 is placed away from the gate electrode pad 92 in plan view (FIG. 2). The electrode film 93 is preferably approximately 1 μm or more away from the gate electrode pad 92. The electrode film 93 is made of metal, such as Al and an alloy thereof. The electrode film 93 is preferably made of the same material as at least one of the source electrode pad 91 and the gate electrode pad 92, and is more preferably made of the same material as both of them.

The electrode film 93 is placed over the upper surface S2 on which the silicon oxide film 11 is disposed. The electrode film 93 is thus insulated from the SiC substrate 50 in the present embodiment. The electrode film 93 may be placed over the upper surface S2 through not only the silicon oxide film 11 but also the interlayer dielectric film 42 and the oxide film 41 as illustrated.

The electrode film 93 includes an anode electrode film 93a and a cathode electrode film 93c. The temperature sensor element 60 is a pn diode, and includes a p-type anode region 61 and an n-type cathode region 62. The anode electrode film 93a and the cathode electrode film 93c are respectively connected to the anode region 61 and the cathode region 62. Each of the anode electrode film 93a and the cathode electrode film 93c has a pad portion (substantially rectangular portion in FIG. 2) and a wiring portion extending from the pad portion (portion extending to have a smaller width than the pad portion in FIG. 2). The pad portion is a portion of the electrode film 93 for electrical connection to the exterior of the MOSFET 101. The temperature sensor element 60 is connected to the wiring portion in the present embodiment. The wiring portion is disposed to electrically connect the temperature sensor element 60 placed away from the pad portion to the pad portion.

Referring to FIGS. 1 and 2, the polyimide film 20 is disposed over the upper surface S2 of the SiC substrate 50 over which the source electrode pad 91, the gate electrode pad 92, and the electrode film 93 are disposed. The polyimide film 20 is disposed as a protective dielectric film of the MOSFET 101. The polyimide film 20 is needed particularly in a semiconductor device handling a high current, that is, a power semiconductor device.

The polyimide film 20 is placed to at least partially expose each of the source electrode pad 91 and the gate electrode pad 92. In other words, the polyimide film 20 is placed to cover only a portion of each of the source electrode pad 91 and the gate electrode pad 92.

The polyimide film 20 is also placed to cover at least portion of the electrode film 93. In the present embodiment, the polyimide film 20 is placed to at least partially expose the pad portion of each of the anode electrode film 93a and the cathode electrode film 93c. In other words, the polyimide film 20 is placed to cover only a portion of each of the anode electrode film 93a and the cathode electrode film 93c. In the present embodiment, the polyimide film 20 is placed to cover the wiring portion of each of the anode electrode film 93a and the cathode electrode film 93c.

To obtain placement as described above, the polyimide film 20 has an opening OP (FIG. 3). The opening OP preferably exposes at least half of the upper surface S2 of the SiC substrate 50 in plan view. In other words, the opening OP preferably covers only less than half of the upper surface S2 of the SiC substrate 50 in plan view. In other words, the opening OP preferably directly or indirectly covers a portion of the upper surface S2 of the SiC substrate 50, but does not directly or indirectly cover at least half of the upper surface S2.

In the present description, phrases "to be exposed" and "to expose" in connection with the polyimide film 20 mean that a certain region is exposed in relation to the polyimide film 20. In other words, these phrases mean that the region is not covered with the polyimide film 20. These phrases thus do not imply exclusion of covering the region with a member other than the polyimide film 20.

The polyimide film 20 has a portion covering the source electrode pad 91, the gate electrode pad 92, and the electrode film 93, and the other portion. The other portion may include a portion covering the barrier film 81 (FIG. 4), a portion covering the barrier film 82 (FIG. 5), a portion (not illustrated) directly covering the interlayer dielectric film 7 between the barrier films 81 and 82, a portion directly covering the upper surface S2 of the SiC substrate 50, and the like.

The polyimide film 20 is made of a thermosetting resin. That is to say, the protective dielectric film is made of a polyimide resin in the present embodiment. The polyimide film 20 preferably has a large thickness in terms of a function to protect a portion to be covered. On the other hand, an extremely large thickness makes patterning of the polyimide film 20 difficult. The polyimide film 20 thus preferably has a thickness of approximately 1 μm or more and approximately 20 μm or less, more preferably has a thickness of approximately 5 μm or more and approximately 20 μm or less, and more preferably has a thickness of approximately 10 μm or more and approximately 20 μm or less. The polyimide film 20 can be formed through application of a liquid material, baking, and patterning. Patterning can be performed using a photomechanical process. A protective dielectric film made of a thermosetting resin different from the polyimide resin may be used. Specifically, a thermosetting resin film made of at least any one of the polyimide resin, a silicone resin, an epoxy resin, and a polyurethane resin can be used as the protective dielectric film.

Referring to FIG. 3, the upper surface S2 of the SiC substrate 50 has a peripheral region RA and an inner region RB enclosed by the peripheral region RA. The polyimide film 20 has a peripheral portion 29 covering the peripheral region RA and has a first inner portion 21 covering at least portion of the electrode film 93. The first inner portion 21 crosses the inner region RB. In other words, the first inner portion 21 crosses an opening of the peripheral portion 29. With this configuration, the opening OP of the polyimide film 20 includes a first opening OP1 and a second opening OP2, and they are separated from each other by the first inner portion 21. The temperature sensor element 60 (FIGS. 6 and 7) is preferably covered with the polyimide film 20. The temperature sensor element 60 is more preferably covered with the first inner portion 21 of the polyimide film 20, and, in this case, the temperature sensor element 60 is placed in the inner region RB of the SiC substrate 50.

In addition to the source electrode pad 91, the gate electrode pad 92, and the electrode film 93 (FIG. 2), an electrode film 94 (not illustrated in FIG. 2) may be disposed as illustrated in FIG. 8. The electrode film 94 can be used, for example, as gate wiring to connect the gate electrode 6 and the gate electrode pad 92.

In the present embodiment, one temperature sensor element is disposed as at least one electrical element covered with the first inner portion 21 of the polyimide film 20. In place of the one temperature sensor element, however, at least one electrical element including at least any one of a diode element, a bipolar transistor element, a resistive element, and a capacitive element may be disposed. An electrical element covered with the polyimide film 20 and not being a unipolar transistor can thereby be placed in the inner region RB of the SiC substrate 50. In a case where not one electrical element but a plurality of electrical elements are disposed, a complex function can be added to the semiconductor device. Especially in a case where a plurality of semiconductor elements are disposed as the plurality of electrical elements, a more complex function, such as a signal processing function, can be added to the semiconductor device. The protective dielectric film is required to have the shape like the shape of the polyimide film 20 in a case where it is not preferable to configure the shape of the opening of the protective dielectric film by one simple quadrilateral, circle, ellipse, or the like because of the above-mentioned placement of at least one electrical element.

COMPARATIVE EXAMPLE

FIG. 9 is a plan view showing a configuration of a MOSFET 100 in a comparative example. FIG. 10 is a plan view for describing a configuration of the polyimide film 20 of the MOSFET 100 (FIG. 9).

The MOSFET 100 in the comparative example and the MOSFET 101 in the present embodiment differ from each other only in shape of the opening of the polyimide film 20. Specifically, the MOSFET 100 has an inner portion 21C (FIG. 10) in place of the first inner portion 21 (FIG. 3) of the MOSFET 101. The inner portion 21C does not cross the inner region RB of the SiC substrate 50. Assume that the shape of the polyimide film 20 is designed only in terms of securing a wider portion for electrical connection between the source electrode pad 91 (FIG. 2) and the exterior, not the first inner portion 21 but the inner portion 21C is to be used.

With the above-mentioned configuration, one end (an upper end in FIG. 10) of the inner portion 21C is separated from the peripheral portion 29 as shown by an arrow DF. Stress concentration to cause cracking and the like is likely to be caused at the end under thermal cycling. As a result, local deterioration of the polyimide film 20 is likely to progress at the end of the inner portion 21C. Deterioration of the polyimide film 20 is thus likely to be caused.

(Effects)

According to the MOSFET 101 in the present embodiment, the polyimide film 20 has the first inner portion 21 (FIG. 3) in contrast to that in the above-mentioned comparative example. The first inner portion 21 crosses the inner region RB enclosed by the peripheral portion 29 of the polyimide film 20, so that one end and the other end of the first inner portion 21 are each connected to the peripheral portion 29 of the polyimide film 20. This suppresses progress of local deterioration of the polyimide film 20 at the one end and the other end of the first inner portion 21. Deterioration of the polyimide film 20 can thereby be suppressed.

The polyimide film 20 preferably has the opening OP (FIG. 3) to expose at least half of the upper surface S2 of the SiC substrate 50. In other words, the opening OP covers only less than half of the upper surface S2 of the SiC substrate 50 in plan view. The portion for electrical connection between the MOSFET 101 and the exterior can thereby be secured to a degree sufficient to handle a high current at the opening OP of the polyimide film 20.

The electrode film 93 may be away from the gate electrode pad 92. A configuration including the electrode film 93 not electrically shorted with the gate electrode pad 92 can thereby be obtained.

The temperature sensor element 60 (FIGS. 6 and 7) is preferably covered with the first inner portion 21 of the polyimide film 20. The temperature sensor element 60 can thereby be placed not in the peripheral region RA but in the inner region RB of the SiC substrate 50 (FIG. 3). The temperature sensor element 60 is thereby placed near the center of the SiC substrate 50. The temperature sensor element 60 is thereby placed at a location representing the temperature of the SiC substrate 50. Temperature detection accuracy can thereby be increased.

Embodiment 2

FIG. 11 is a plan view schematically showing a configuration of a MOSFET 102 (semiconductor device) in Embodiment 2. FIG. 12 is a plan view for describing a configuration of the polyimide film 20 (FIG. 11). In the MOSFET 102, the polyimide film 20 has at least one second inner portion 22 in addition to the peripheral portion 29 and the first inner portion 21. Each second inner portion 22 crosses between the peripheral portion 29 and the first inner portion 21. This will be described in more detail below.

The inner region RB (FIG. 3) of the SiC substrate 50 has a first region RBa and a second region RBb separated from each other by the first inner portion 21. In the present embodiment, a second inner portion 22a and a second inner portion 22b of the polyimide film 20 are respectively disposed in the first region RBa and the second region RBb of the SiC substrate 50. The number of second inner portions 22 is two in the present embodiment, but may be any number.

A configuration other than the above-mentioned configuration is substantially the same as the above-mentioned configuration in Embodiment 1, so that the same or corresponding components bear the same reference sign, and description thereof is not repeated.

According to the present embodiment, the polyimide film 20 has the second inner portion 22 (FIG. 12) crossing between the peripheral portion 29 and the first inner portion 21. The first inner portion 21 is thereby connected to the other portion (i.e., the second inner portion 22) of the polyimide film 20 at a location between the one end and the other end of the first inner portion 21. This suppresses deterioration of the long-extending first inner portion 21, which is locally subjected to stress between the one end and the other end thereof.

The second inner portion 22 herein crosses between the peripheral portion 29 and the first inner portion 21. One end and the other end of the second inner portion 22 are thereby each connected to the other portion of the polyimide film 20. Progress of local deterioration of the polyimide film 20 at the one end and the other end of the second inner portion 22 is suppressed.

As described above, by disposing the second inner portion 22, deterioration of the first inner portion 21 is further suppressed, and the second inner portion 22 itself is less likely to be deteriorated. Deterioration of the polyimide film 20 can thereby be further suppressed.

Embodiment 3

FIG. 13 is a plan view schematically showing a configuration of a MOSFET 103 (semiconductor device) in Embodiment 3. FIG. 14 is a schematic partial sectional view taken along the line XIV-XIV of FIG. 13.

In the present embodiment, an edge of the opening OP of the polyimide film 20 is not right-angled but is gently curved on chip corner sides OPc (FIG. 13). This can prevent cracking of the polyimide film 20 on the chip corner sides OPc. The reason will be described below.

Stress caused by a difference in coefficient of thermal expansion between the SiC substrate 50 and an insulating member or a metal member disposed thereon leads to expansion and contraction of a chip in a planar direction. The expansion and contraction become noticeable, in particular, at corners of the chip. Due to the influence, the polyimide film 20 typically tends to be cracked on the chip corner sides OPc. According to the above-mentioned configuration, the expansion and contraction are reduced to prevent cracking of the polyimide film 20 on the chip corner sides OPc.

As illustrated in FIG. 13, the polyimide film 20 preferably covers an edge (see broken lines in FIG. 13) of each of the source electrode pad 91, the gate electrode pad 92, and the electrode film 93. A region other than the source electrode pad 91, the gate electrode pad 92, and the electrode film 93 as a whole can thereby be protected by the polyimide film 20 in plan view.

Figure 15:
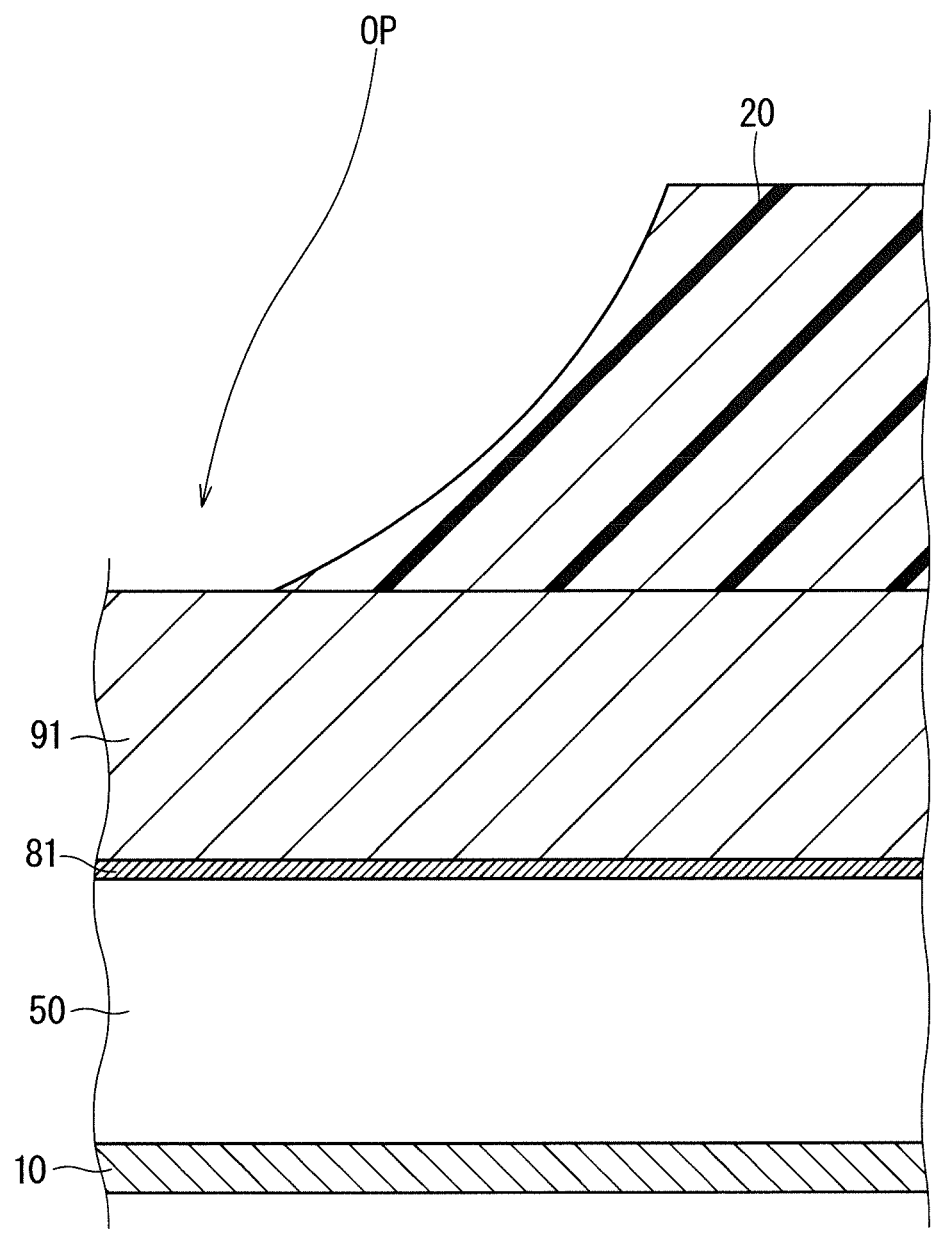
FIG. 15 is an enlarged view of a portion of FIG. 14, and is a partial sectional view showing a first example of a cross-sectional shape of a protective dielectric film.
Figure 16:
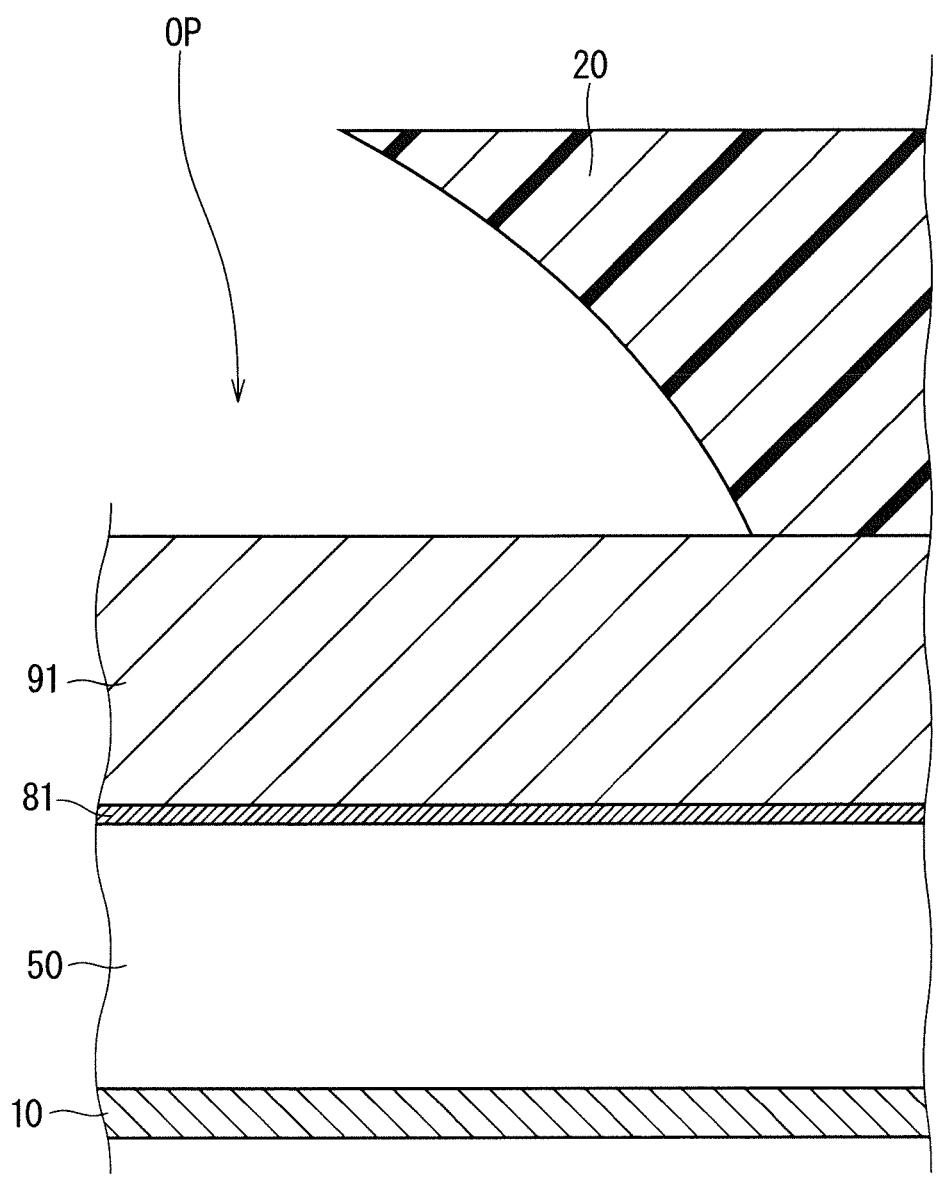
FIG. 16 is an enlarged view of the portion of FIG. 14, and is a partial sectional view showing a second example of the cross-sectional shape of the protective dielectric film.
Figure 17:
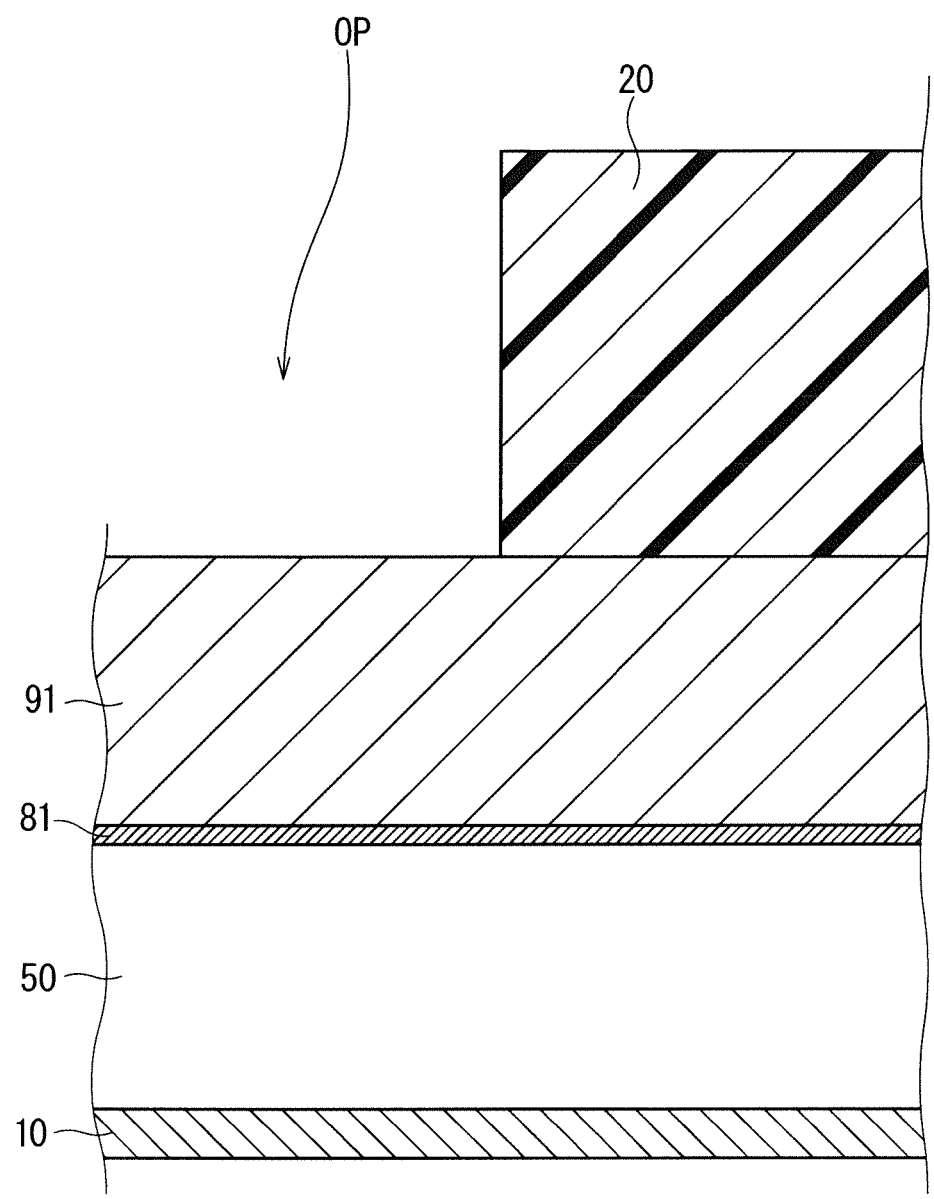
FIG. 17 is an enlarged view of the portion of FIG. 14, and is a partial sectional view showing a third example of the cross-sectional shape of the protective dielectric film.

FIGS. 15 to 17 are each an enlarged view of a portion of FIG. 14, and are partial sectional views showing first to third examples of a cross-sectional shape of the polyimide film 20. The polyimide film 20 has a tapered cross-sectional shape and a reverse tapered cross-sectional shape respectively in FIGS. 15 and 16. Such cross-sectional shapes can be obtained by patterning the polyimide film 20 by wet etching. Use of wet etching can increase an etching speed and reduce a process cost compared with dry etching. On the other hand, in FIG. 17, the polyimide film 20 has a cross-sectional shape having a side wall extending substantially along the thickness thereof. Such a cross-sectional shape is likely to be obtained in a case where the polyimide film 20 is patterned by dry etching. In this case, a corner portion (an upper left portion in FIG. 17) having a side wall steeper than that in a case of FIG. 15 and having an angle of approximately 90° is formed. In such a corner portion, film stress concentration caused by heat shrinkage is likely to be caused, and thus the polyimide film 20 is likely to be cracked due to film stress. In contrast, in a case where a tapered shape as illustrated in FIG. 15 is used, the corner portion has an angle of more than 90°, so that film stress is likely to be relieved to prevent cracking of the polyimide film 20 caused by film stress.

In a case where the polyimide film 20 having a cross-sectional shape as illustrated in FIG. 15 is used, the first inner portion 21 (see FIG. 3) of the protective dielectric film 20 also has a tapered cross-sectional shape as illustrated in FIG. 18. An edge of the cross-sectional shape as a whole can be curved as illustrated in FIG. 18 to further relieve film stress concentration.

As illustrated in FIG. 14, a termination structure 30 is preferably disposed below the polyimide film 20 at an end of the main surface (upper surface in FIG. 14) of the SiC substrate 50. The termination structure 30 is disposed to secure a breakdown voltage. A specific configuration of the termination structure 30 is not particularly limited, but, in an example illustrated in FIG. 14, a p-type well region 31, an n-type region 32 formed thereon, and a p-type guard ring region 33 are formed.

A configuration other than the above-mentioned configuration is substantially similar to the above-mentioned configuration in Embodiment 1, so that the same or corresponding components bear the same reference sign, and description thereof is not repeated. Features of the polyimide film 20 described in the present embodiment are applicable to each of Embodiments 1 and 2.

(Modification)

FIG. 19 is a partial sectional view schematically showing a configuration of a MOSFET 103V (semiconductor device) in a modification of the MOSFET 103 (FIG. 14). The MOSFET 103V includes a plating layer 96 (metal layer) on the source electrode pad 91 and the gate electrode pad 92. The plating layer 96 is desirable especially in a case where the source electrode pad 91 and the gate electrode pad 92 are made of Al or an Al alloy. A similar plating layer may be disposed on the electrode film 93. The plating layer 96 is in contact with an inner edge of the polyimide film 20. The plating layer 96 is preferably an electroless plating layer, and is, for example, an electroless nickel phosphorus plating layer. In a case where electroless plating is used, it is easy to form, after formation of the polyimide film 20 having the opening OP, the plating layer 96 only inside the opening OP of the polyimide film 20. The plating layer 96 may be placed throughout the opening OP in plan view. The plating layer 96 preferably only partially fills a space formed by the opening OP of the polyimide film 20 along the thickness thereof.

A similar plating layer (metal layer) may be disposed on the rear electrode 10. Such a plating layer is desirable in a case where the rear electrode 10 is made of Al or an Al alloy.

Embodiment 4

Figure 20:
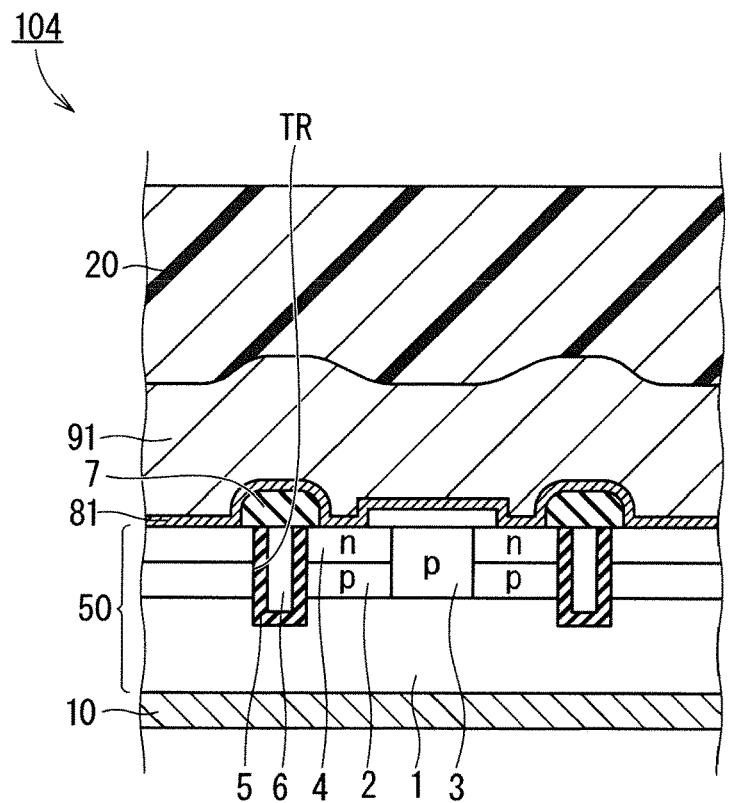
FIG. 20 is a partial sectional view schematically showing a configuration of a semiconductor device in Embodiment 4 of the present invention.

FIG. 20 is a partial sectional view schematically showing a configuration of a MOSFET 104 in Embodiment 4. While the gate electrode 6 of the MOFET 101 (FIG. 4: Embodiment 1) has the planar structure, the gate electrode 6 has a trench structure in the present embodiment. This will be described in more detail below.

In the MOSFET 104, the upper surface S2 of the SiC substrate 50 has a trench TR. The trench TR penetrates the source region 4 and the base region 2 to reach the drift layer 1. The gate electrode 6 is placed in the trench TR through the gate dielectric film 5. The trench structure is thereby obtained. As with the above-mentioned planar structure, the trench structure is a structure suitable for the power semiconductor device that is the semiconductor device handling the high current. In a case of handling the high current as described above, the protective dielectric film like the polyimide film 20 is particularly required.

A configuration other than the above-mentioned configuration is substantially the same as the above-mentioned configuration in any of Embodiments 1 to 3, so that the same or corresponding components bear the same reference sign, and description thereof is not repeated. Effects similar to those obtained in Embodiments 1 to 3 described above can be obtained in the present embodiment.

Embodiment 5

Figure 21:
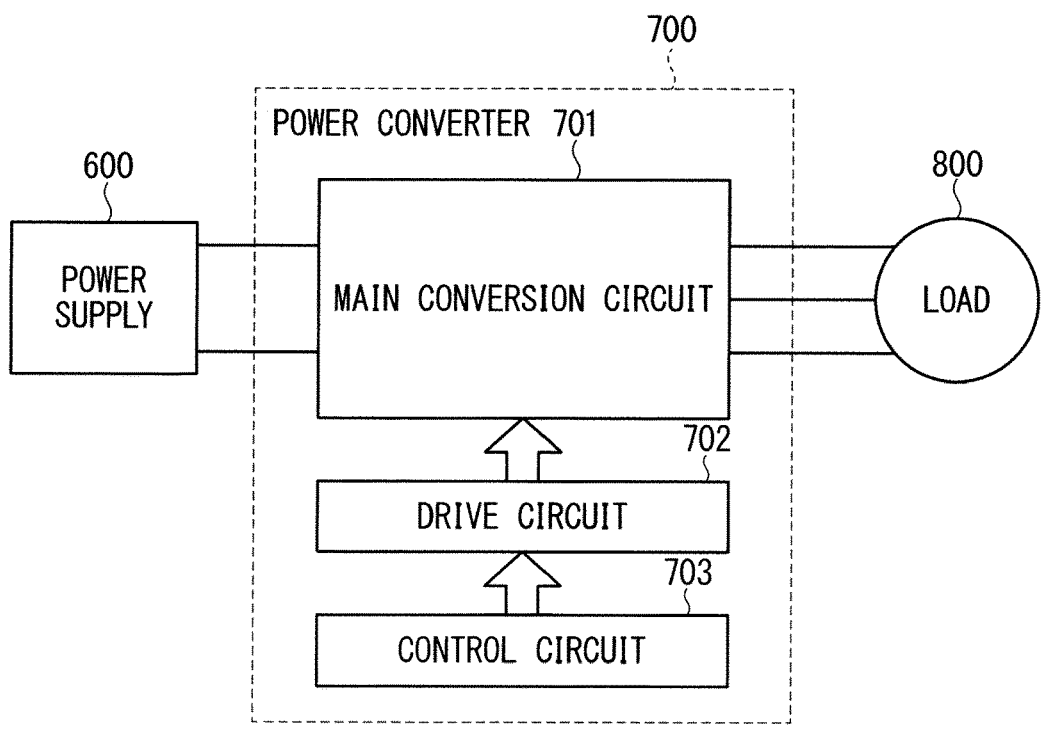
FIG. 21 is a block diagram schematically showing a configuration of a power conversion system to which a power converter in Embodiment 5 of the present invention is applied.

FIG. 21 is a block diagram schematically showing a configuration of a power conversion system to which a power converter 700 in Embodiment 5 is applied.

In Embodiment 5, the above-mentioned semiconductor device in any of Embodiments 1 to 4 or the modifications thereof is applied to the power converter. The present invention is not limited to any particular power converter, but a case where the present invention is applied to a three-phase inverter will be described below as Embodiment 5.

FIG. 21 is the block diagram schematically showing the configuration of the power conversion system to which the power converter 700 in Embodiment 5 of the present invention is applied.

The power converter 700 is a three-phase inverter connected between a power supply 600 and a load 800, and converts DC power supplied from the power supply 600 into AC power, and supplies the AC power to the load 800. The power converter 700 includes a main conversion circuit 701, a drive circuit 702, and a control circuit 703. The main conversion circuit 701 includes, as a switching element, at least any of the semiconductor devices (e.g., the MOSFETs 101 to 104) in Embodiments 1 to 4 and the modifications thereof, and converts the DC power as input into the AC power for output. The drive circuit 702 outputs a drive signal to drive each semiconductor device as the switching element to the semiconductor device. The control circuit 703 outputs, to the drive circuit 702, a control signal to control the drive circuit 702.

The power supply 600 is a DC power supply, and supplies the DC power to the power converter 700. The power supply 600 can be configured in various forms, and, for example, can be configured by a DC system, a solar cell, or a storage battery, and may be configured by a rectifier circuit or an AC/DC converter connected to an AC system. The power supply 600 may be configured by a DC/DC converter to convert the DC power output from the DC system into predetermined power.

The load 800 is a three-phase motor driven by the AC power supplied from the power converter 700. The load 800 is not limited to a load for a particular application, and is a motor mounted on various types of electrical equipment, and is used, for example, as a motor for hybrid vehicles, electric vehicles, railroad vehicles, elevators, or air-conditioning equipment.

The power converter 700 will be described in detail below. The main conversion circuit 701 includes the switching element and a freewheeling diode (not illustrated). The main conversion circuit 701 converts the DC power supplied from the power supply 600 into the AC power upon switching of the switching element, and supplies the AC power to the load 800. The main conversion circuit 701 can have various specific circuit configurations, and the main conversion circuit 701 in the present embodiment is a two-level three-phase full-bridge circuit, and can be configured by six switching elements and six freewheeling diodes connected in anti-parallel to the respective switching elements. Every two switching elements out of the six switching elements are connected in series to each other to constitute upper and lower arms, and the upper and lower arms constitute respective phases (a U phase, a V phase, and a W phase) of the full-bridge circuit. Output terminals of the respective upper and lower arms, that is, three output terminals of the main conversion circuit 701 are connected to the load 800.

The drive circuit 702 generates the drive signal to drive each of the switching elements of the main conversion circuit 701, and supplies the drive signal to a control electrode of the switching element of the main conversion circuit 701. Specifically, the drive circuit 702 outputs, to the control electrode of each of the switching elements, a drive signal to switch the switching element to an on state and a drive signal to switch the switching element to an off state in accordance with the control signal from the control circuit 703, which will be described below. The drive signal is a voltage signal (an on signal) equal to or greater than a threshold voltage of the switching element in a case where the switching element is maintained in the on state, and is a voltage signal (an off signal) equal to or smaller than the threshold voltage of the switching element in a case where the switching element is maintained in the off state.

The control circuit 703 controls the switching element of the main conversion circuit 701 so that desired power is supplied to the load 800. Specifically, the control circuit 703 calculates, based on power to be supplied to the load 800, time (on time) during which each of the switching elements of the main conversion circuit 701 is to be in the on state. For example, the main conversion circuit 701 can be controlled through pulse width modulation (PWM) control to modulate the on time of the switching element in accordance with a voltage to be output. The control circuit 703 outputs a control command (the control signal) to the drive circuit 702 so that the on signal is output to a switching element to be in the on state, and the off signal is output to a switching element to be in the off state at each time point. In accordance with the control signal, the drive circuit 702 outputs the on signal or the off signal as the drive signal to the control electrode of each of the switching elements.

According to Embodiment 5, the main conversion circuit 701 includes, as the switching element, at least any of the semiconductor devices (e.g., the MOSFETs 101 to 104) in Embodiments 1 to 4 and the modifications thereof. In these semiconductor devices, progress of local deterioration of the polyimide film 20 is suppressed as described above. Deterioration of the polyimide film 20 due to thermal cycling caused by operation of the power converter 700 can thereby be suppressed. Reliability of the power converter 700 to perform operation accompanied by thermal cycling can thus be enhanced.

A case where the present invention is applied to the two-level three-phase inverter is described in Embodiment 5, but the present invention is not limited to that applied to the two-level three-phase inverter, and is applicable to various power converters. While the power converter is the two-level power converter in Embodiment 5, the power converter may be a multi-level power converter, such as a three-level power converter. The present invention may be applied to a single-phase inverter in a case where power is supplied to a single-phase load. The present invention is applicable to the DC/DC converter or the AC/DC converter in a case where power is supplied to a DC load and the like.

The power converter to which the present invention is applied is not limited to that in the above-mentioned case where the load is the motor, and can be used as a power supply device of any of an electrical discharge machine, a laser machine, an induction cooker, and a noncontact power supply system, and can further be used as a power conditioner of a photovoltaic system, a storage system, or the like, for example.

While a case where the semiconductor device is the MOSFET is described in detail in each of the above-mentioned embodiments, the semiconductor device may be a metal insulator semiconductor field effect transistor (MISFET), which is not the MOSFET. The semiconductor device may be a transistor other than the MISFET, and may be an insulated gate bipolar transistor (IGBT), for example. To obtain the IGBT, a collector region having the second conductivity type is only required to be added between the above-mentioned rear electrode 10 and the drift layer 1 having the first conductivity type. In this case, the above-mentioned source functions as an emitter of the IGBT, and the rear electrode 10 functions as a collector electrode.

While a case where the semiconductor substrate is made of SiC is described in detail in each of the above-mentioned embodiments, the semiconductor substrate may be made of a semiconductor other than SiC having a higher linear expansion coefficient than Si. For example, a semiconductor substrate made of gallium arsenide (GaAs) or gallium nitride (GaN) may be used.

While a case where the first conductivity type is the n type and the second conductivity type is the p type is described in each of the above-mentioned embodiments, the first conductivity type may be the p type and the second conductivity type may be the n type.

Embodiments of the present invention can freely be combined with each other, and can be modified or omitted as appropriate within the scope of the invention. While the invention has been described in detail, the foregoing description is in all aspects illustrative and not restrictive. It is therefore understood that numerous modifications not having been described can be devised without departing from the scope of the invention.

EXPLANATION OF REFERENCE SIGNS

S1 lower surface, S2 upper surface (main surface), RA peripheral region, RB inner region, OP opening, OP1 first opening, OP2 second opening, TR trench, RBa first region, RBb second region, 1 drift layer, 2 base region, 3 contact region, 4 source region, 5 gate dielectric film, 6 gate electrode, 7, 42 interlayer dielectric film, 8 source contact electrode, 10 rear electrode, 11 silicon oxide film, 20 polyimide film (protective dielectric film), 21 first inner portion, 22, 22a, 22b second inner portion, 29 peripheral portion, 41 oxide film, 50 SiC substrate (semiconductor substrate), 60 temperature sensor element (electrical element), 61 anode region, 62 cathode region, 81, 82 barrier film, 91 source electrode pad (first electrode film), 92 gate electrode pad (second electrode film), 93 electrode film (third electrode film), 93a anode electrode film, 93c cathode electrode film, 94 electrode film, 101 to 104 MOSFET (semiconductor device), 600 power supply, 700 power converter, 701 main conversion circuit, 702 drive circuit, 703 control circuit, 800 load.

The invention claimed is:

1. A semiconductor device comprising:
   a semiconductor substrate made of a semiconductor having a higher linear expansion coefficient than silicon, the semiconductor substrate including a source region having a first conductivity type, a base region having a second conductivity type different from the first conductivity type, and a drift layer separated from the source region by the base region and having the first conductivity type, the semiconductor substrate having a main surface including a portion formed of the source region;
   a gate dielectric film covering the base region of the semiconductor substrate;
   a gate electrode facing the base region of the semiconductor substrate through the gate dielectric film;
   a first electrode film electrically connected to the source region of the semiconductor substrate, and disposed over the main surface of the semiconductor substrate;
   a second electrode film electrically connected to the gate electrode, and disposed over the main surface of the semiconductor substrate away from the first electrode film;
   a third electrode film disposed over the main surface of the semiconductor substrate away from the first electrode film; and
   a protective dielectric film disposed over the main surface of the semiconductor substrate, the main surface provided with the first electrode film, the second electrode film, and the third electrode film, the protective dielectric film covering only a portion of each of the first electrode film and the second electrode film and covering at least portion of the third electrode film, the protective dielectric film being made of a thermosetting resin, wherein the main surface of the semiconductor substrate has a peripheral region and an inner region enclosed by the peripheral region, and the protective dielectric film has a peripheral portion covering the peripheral region and has a first inner portion covering at least portion of the third electrode film and crossing the inner region, the semiconductor device further comprises at least one electrical element connected to the third electrode film, and covered with the first inner portion of the protective dielectric film, the protective dielectric film has an opening so that the protective film covers less than half of the main surface of the semiconductor substrate, the opening has an edge in plan view having a first corner portion on a corner side of the main surface, and the first corner portion is curved, the edge of the opening has, in the plan view, a second corner portion formed with the peripheral region and the first inner portion of the protective dielectric film, and the first corner portion is curved more gently than the second corner portion, wherein the at least one electrical element is entirely covered with the first inner portion of the protective dielectric film in plan view and is located in the inner region closer to a center of the semiconductor device than an edge of the semiconductor device.

2. The semiconductor device according to claim 1, wherein
a portion of the protective dielectric film covering the at least one electrical element has a thickness of 1 µm or more and 20 µm or less.

3. The semiconductor device according to claim 1, wherein
the third electrode film includes:
a pad portion for electrical connection to an exterior of the semiconductor device; and
a wiring portion having a first end connected to the pad portion and a second end connected to the at least one electrical element.

4. The semiconductor device according to claim 3, wherein
the second end of the wiring portion is an end of the third electrode film, and is disposed away from the peripheral region of the main surface.

5. The semiconductor device according to claim 3, wherein
the third electrode film does not cross the inner region of the main surface.

6. The semiconductor device according to claim 3, wherein
the pad portion is at least partially included in the peripheral region of the main surface.

7. The semiconductor device according to claim 3, wherein
the at least one electrical element includes a temperature sensor element.

8. The semiconductor device according to claim 1, wherein
the at least one electrical element includes an electrical element placed in a center of the main surface.

9. The semiconductor device according to claim 1, wherein
the protective dielectric film has a second inner portion crossing between the peripheral portion and the first inner portion.

10. The semiconductor device according to claim 1, wherein
the third electrode film is disposed away from the second electrode film.

11. The semiconductor device according to claim 1, wherein
the at least one electrical element includes at least any one of a diode element, a bipolar transistor element, a resistive element, and a capacitive element.

12. The semiconductor device according to claim 1, wherein
the gate electrode has a planar structure or a trench structure.

13. The semiconductor device according to claim 1, wherein
the first inner portion of the protective dielectric film has a tapered cross-sectional shape.

14. The semiconductor device according to claim 1, wherein
the protective dielectric film is made of at least any one of a polyimide resin, a silicone resin, an epoxy resin, and a polyurethane resin.

15. A power converter comprising:
a main conversion circuit to convert input power for output, the main conversion circuit including the semiconductor device according to claim 1;
a drive circuit to output, to the semiconductor device, a drive signal to drive the semiconductor device; and
a control circuit to output, to the drive circuit, a control signal to control the drive circuit.

16. The semiconductor device according to claim 1, wherein the edge of the opening is an outermost edge.

17. The semiconductor device according to claim 1, wherein the edge of the opening has a third corner portion and a fourth corner portion in the plan view, and the first corner portion is curved more gently than the third corner portion and the fourth corner portion.

18. The semiconductor device according to claim 17, wherein the edge of the opening has a first straight portion between the first corner portion and the second corner portion, a second straight portion between the second corner portion and the third corner portion, a third straight portion between the third corner portion and the fourth corner portion, and a fourth straight portion between the fourth corner portion and the first corner portion.

19. The semiconductor device according to claim 18, wherein, of all the corner portions from the first to the fourth corner portions, the first corner portion is located closest to any corner side of the main surface.

* * * * *